United States Patent [19]
Hayashi et al.

[11] Patent Number: 5,963,010
[45] Date of Patent: Oct. 5, 1999

[54] BATTERY CONTROLLER FOR CONTROLLING BATTERIES OF DIFFERENT KINDS AND INCLUDING BATTERY MONITORING MEANS FOR CALCULATING REMAINING OPERATION TIME AND AN INFORMATION PROCESSING APPARATUS INCLUDING SUCH BATTERY CONTROLLER

[75] Inventors: Yoshihiro Hayashi, Sagamihara; Satoshi Ozeki, Ebina, both of Japan; Thomas Kao, Hsin-Chuang; Will Chen, Taoynan, both of Taiwan

[73] Assignees: Hitachi, Ltd., Tokyo, Japan; Clevo Co., Taiwan

[21] Appl. No.: 08/961,421

[22] Filed: Oct. 30, 1997

[30] Foreign Application Priority Data

Oct. 31, 1996 [JP] Japan ................................ 8-288917

[51] Int. Cl.$^6$ ................................................ H01M 10/46
[52] U.S. Cl. .......................................... 320/106; 320/110
[58] Field of Search ..................... 320/106, 110, 320/119, 132, 136, 149, 153, FOR 114, FOR 129, FOR 134, FOR 138, FOR 142, FOR 147, DIG. 18, DIG. 21

[56] References Cited

U.S. PATENT DOCUMENTS

| 5,602,455 | 2/1997 | Stephens et al. | 320/106 |
| 5,635,813 | 6/1997 | Shiga et al. | 320/106 |
| 5,726,555 | 3/1998 | Takamoro | 320/106 X |
| 5,744,937 | 4/1998 | Cheon | 320/106 X |

*Primary Examiner*—Edward H. Tso
*Attorney, Agent, or Firm*—Fay, Sharpe, Beall, Fagan, Minnich & McKee

[57] ABSTRACT

A battery controller for controlling at least two batteries of different kinds, includes a kind-of-battery detection unit for detecting a kind of battery, and a battery switching unit in which a switching voltage, a suspended mode shift voltage and a termination voltage having different values in accordance with the kind of the battery detected by the kind-of-battery detector are previously set to compare an output voltage of a battery being discharged with the previously set switching voltage, suspended mode shift voltage and termination voltage so that switching of the battery being discharged, stopping of operation of an apparatus being supplied with electric power by the battery being discharged or stopping of supply of electric power by the battery being discharged is performed.

5 Claims, 6 Drawing Sheets

BATTERY CONTROLLER FOR CONTROLLING BATTERIES OF DIFFERENT KINDS AND INCLUDING BATTERY MONITORING MEANS FOR CALCULATING REMAINING OPERATION TIME AND AN INFORMATION PROCESSING APPARATUS INCLUDING SUCH BATTERY CONTROLLER

BACKGROUND OF THE INVENTION

The present invention relates to a battery controller for controlling batteries of different kinds and more particularly to a battery controller for controlling batteries of different kinds which are equipped in a portable information processing apparatus or communication apparatus. Further, the present invention relates to a note-type personal computer equipped with the battery controller.

Conventional apparatuses such as note-type personal computers, portable telephones, portable cassette players and handy video cameras include a battery for supplying electric power to internal circuits provided in the apparatuses when an external power supply is not connected thereto.

A battery used in the portable information processing apparatus or the like includes a NiCd battery, a NiMH battery or a Li ion battery.

The NiCd battery uses nickel for a positive pole and cadmium for a negative pole and has excellent low temperature characteristic and overcharge/overdischarge resistant characteristic. Further, the NiCd battery has a long life and a low manufacturing cost but has problems such as a large memory effect, a low electric power capacity per unit weight and environmental disruption due to cadmium.

The memory effect is one of characteristic of a secondary battery which can be re-charged. When the battery is re-charged in the state where electric power in the battery is not discharged completely, the battery memorizes the charge level remaining therein upon the re-charging operation and when the charge level remaining upon the re-charging operation is reached in the re-discharging operation, the battery stops the discharging although electric power in the battery is not discharged completely.

The NiMH battery uses nickel for a positive pole and hydrogen-occluding alloy for a negative pole and has a larger electric power capacity per unit weight and a smaller memory effect as compared with the NiCd battery.

The Li battery uses material which occludes and emits lithium ions in positive and negative poles and generally uses $LiCoO_2$ for the positive pole and carbon for the negative pole.

The Li ion battery has an excellent feature that the electric power capacity per unit weight is larger than the NiMH battery and there is no memory effect, while since the Li ion battery has cobalt contained in the positive pole thereof, it is difficult to reduce a manufacturing cost of the positive pole and a peripheral circuit for preventing reduction of the safety and deterioration of the performance upon the overcharging operation is indispensable for the Li ion battery.

Further, various batteries used in the conventional portable information processing apparatus or the like have different charging and discharging characteristics.

More particularly, a constant-current charging system is used to charge the NiMH battery. The NiMH battery is charged by a rapid charging current recommended by a battery maker and a temperature of the battery is detected at a thermistor terminal thereof to finish the charging.

In addition, a constant-current and constant-voltage charging system is used to charge the Li ion battery. In the constant-current and constant-voltage charging system, the battery is first charged by a constant current and when a terminal voltage of the battery reaches a predetermined value, the battery is switched to be charged by a constant voltage and then after an elapse of predetermined time the charging is finished.

As different points of the discharging characteristics of the NiMH battery and the Li ion battery, a very low battery voltage and a final or termination voltage are different.

The very low battery voltage is a voltage at which an apparatus equipped with the battery is shifted to a suspended mode. In portable personal computers or the like, the operation mode is shifted to the suspended mode when this voltage is reached, to prevent stoppage of supply of electric power.

Further, the termination voltage is a voltage for stopping supply of electric power by the battery. Since there are any cells in which discharging is insufficient when the termination voltage is too high and which is overdischarged when the termination voltage is too low, it is necessary to set the termination voltage carefully.

In the conventional portable information apparatus or the like, the charging and discharging characteristics are largely different depending on a kind of a battery mounted therein and accordingly the apparatus cannot use a battery of different kind.

SUMMARY OF THE INVENTION

It is an object of the present invention to provide a battery controller capable of effectively utilizing the capacity of batteries of various kinds and preventing overcharging.

It is another object of the present invention to provide a battery controller capable of charging batteries of various kinds.

It is another object of the present invention to provide a battery controller capable of calculating a total remaining operation time of a plurality of batteries.

These and other objects and novel features of the present invention will be apparent from the following description of the specification and the accompanying drawings.

Brief description of representative aspects disclosed in the present invention is as follows:

(1) In the battery controller for controlling a plurality of batteries of various kinds simultaneously, electric power is supplied to an apparatus connected to the batteries while switching the plurality of batteries of different kinds.

The battery controller examines whether batteries are mounted in slots in which the plurality of batteries of various kinds can be mounted and when batteries are mounted in the slots, the kind of at least two batteries mounted in the slots is detected by kind-of-battery detection means.

For example, when the batteries mounted in the slots include thermistor terminals indicating temperature of the batteries, the kind-of-battery detection means of the battery controller measures impedances of the thermistor terminals to detect the kind of the batteries.

Discharge switching means of the battery controller stops using of a battery being discharged currently and starts to discharge another battery. The discharge switching means is supplied with the kind of battery detected by the kind-of-battery detection means and an output voltage of the battery being discharged.

The discharge switching means examines in accordance with the kind of battery detected by the kind-of-battery detection means whether the output voltage of the battery being discharged reaches a previously set battery switching voltage which is different depending on the kind of battery.

As the result that the discharge switching means examines the output voltage of the battery being discharged, when the output voltage of the battery being discharged reaches a battery switching voltage, the battery being discharged is switched.

Further, when the other battery is not mounted in case where the battery being charged is switched, the battery continues to be discharged even after the output voltage of the battery reaches the battery switching voltage. The discharge switching means examines in accordance with the kind of battery detected by the kind-of-battery detection means whether or not the output voltage of the battery being discharged reaches the previously set suspended mode shift voltage which is different depending on the kind of battery.

As the result that the discharge switching means examines the output voltage of the battery being discharged, when the output voltage of the battery being discharged reaches the previously set suspended mode shift voltage, the signal for shifting an apparatus including the battery controller to the suspended mode is produced.

When the apparatus including the battery controller is an information processing unit having the suspended mode and the apparatus receives the signal for shifting the apparatus to the suspended mode from the battery controller, the apparatus stops usual operation and is shifted to a mode in which consumption power is suppressed extremely.

When a battery which has been charged is newly mounted in the information processing unit having the suspended mode or an external power supply is connected thereto in the suspended mode, the information processing apparatus can be returned to the usual operation again.

When a battery which has been charged is not mounted in the information processing unit having the suspended mode or an external power supply is not connected thereto in the suspended mode, switching control means examines in accordance with the kind of battery detected by the kind-of-battery detection means whether the output voltage of the battery being discharged reaches a previously set termination voltage which is different depending on the kind of battery.

As the result that the switching control means examines the output voltage of the battery being discharged, when the output voltage of the battery being discharged reaches the termination voltage, supply of electric power to the apparatus body including the battery controller is stopped.

As described above, according to the battery controller, since the battery is discharged in accordance with the previously set battery switching voltage, suspended mode shift voltage and termination voltage which are different depending on the detected kind of battery, the capacity of the batteries of different kinds can be used effectively and overdischarging can be prevented.

(2) In the battery controller described in the item (1), the batteries of different kinds are charged.

The battery controller includes a constant current charging circuit and a constant voltage charging circuit, for example, as battery charging means for charging the batteries of different kinds and controls charging in combination of the two charging circuits.

When the external power supply is connected after supply of electric power by the battery, the charge control means operates the battery charging means in accordance with the kind of battery detected by the kind-of-battery detection means and the battery is charged in combination of the constant current charging circuit and the constant voltage charging circuit.

For example, when the battery the kind of which is detected by the kind-of-battery detection means is an NiMH battery, the constant current charging is made in which the constant current charging circuit of the battery charging means is used to charge the battery by a rapid charging current recommended by a battery maker and a temperature of the battery is detected by means of the thermistor terminal to terminate the charging.

Further, when the battery the kind of which is detected by the kind-of-battery detection means is an Li ion battery, the constant current and constant voltage charging is made in which the constant current charging circuit and the constant voltage charging circuit of the battery charging means are used to first charge the battery by the constant current and then switch the constant current charging to the constant voltage charging when a terminal voltage of the battery reaches a predetermined value and after an elapse of a predetermined time the charging is finished.

As described above, according to the battery controller, since the kind of battery is detected to control charging of the battery in combination of the constant current charging and the constant voltage charging, batteries of different kinds can be charged.

(3) In the battery controller described in the items (1) and (2), the total remaining operation time of the battery being discharged and the battery not discharged is calculated.

When remaining operation time calculation means is started in case where an apparatus including the battery controller is operated, the remaining operation time calculation means requires data relative to the remaining capacity and the remaining operation time of a plurality of batteries to battery monitoring means of the plurality of batteries.

When the remaining operation time calculation means receives the data from the battery monitoring means of the plurality of batteries, the remaining operation time calculation means uses the data relative to the remaining capacity and the remaining operation time of the batteries being discharged to calculate the remaining operation time of the batteries not discharged.

The remaining operation time calculation means adds the remaining operation time of the battery being discharged obtained from the battery monitoring means and the calculated remaining operation time of the battery not discharged to calculate the total remaining operation time.

Since a battery monitoring IC included in the smart battery which supports the standard specification "smart battery" uses an average discharge current value to calculate the remaining operation time, the remaining operation time in the unoperated state is largely different from the remaining operation time in the discharging operation.

Accordingly, the battery controller calculates the remaining operation time of the battery not discharged on the basis of the relation of the remaining capacity and the remaining operation time of the battery being discharged.

As described above, according to the battery controller, since data of the battery being discharged is used to calculate the remaining operation time of the battery not discharged, the total remaining operation time of the plurality of batteries can be calculated.

DETAILED DESCRIPTION OF THE PREFERRED EMBODIMENTS

A battery controller according to an embodiment of the present invention is now described in which a microcomputer for a keyboard of a personal computer is used in combination therewith to charge and discharge two different kinds of batteries and display a remaining operation time of the batteries.

Figure 1:
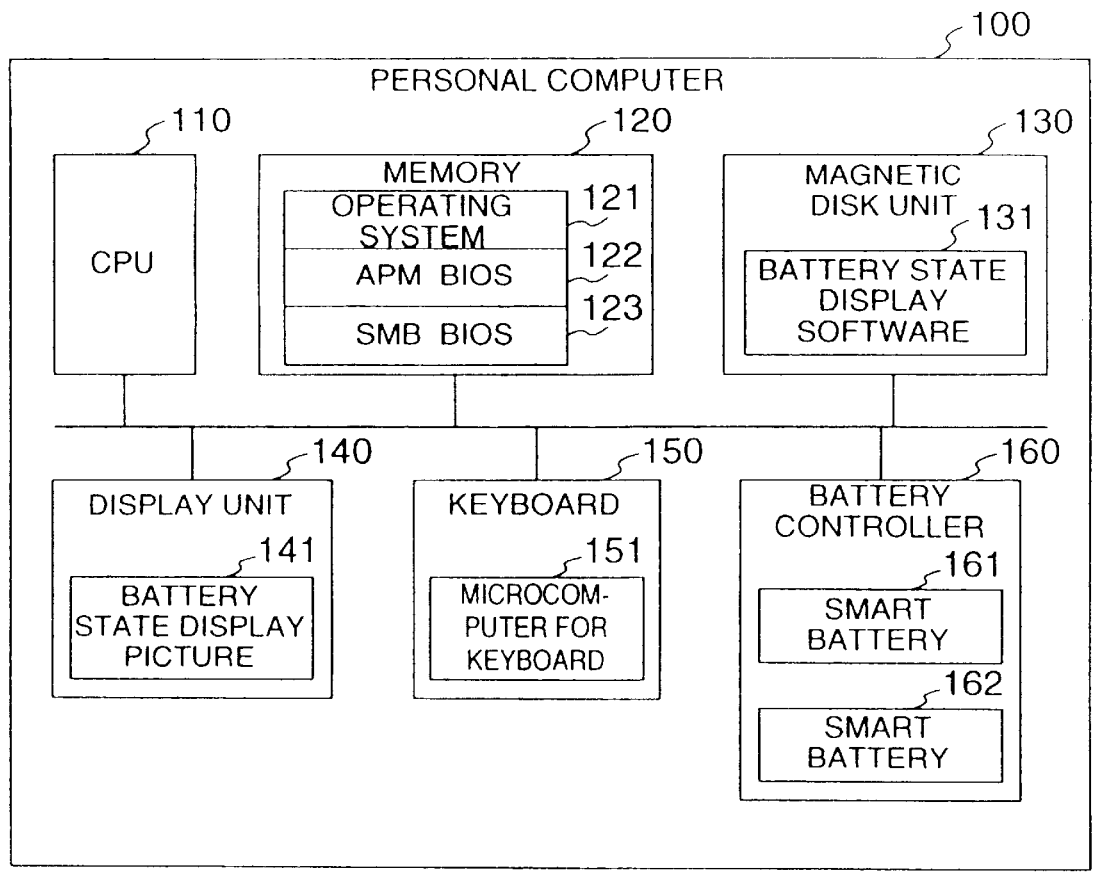
FIG. 1 is a block diagram schematically illustrating a personal computer equipped with a battery controller of the present invention.

FIG. 1 is a schematic diagram illustrating a personal computer of the embodiment. In FIG. 1, numeral 100 denotes a personal computer, 110 a CPU, 120 a memory, 121 an operating system, 122 an advanced power management basic input/output system (hereinafter referred to as APM-BIOS), 123 a system management bus basic input/output system (hereinafter referred to as SMB-BIOS), 130 a magnetic disk unit, 131 a battery state display software, 140 a display unit, 141 a battery state display picture, 150 a keyboard, 151 a microcomputer for a keyboard, 160 a battery controller, and 161 and 162 smart batteries.

As shown in FIG. 1, the personal computer of the embodiment includes the CPU 110, the memory 120, the operating system 121, the APM-BIOS 122, the SMB-BIOS 123, the magnetic disk unit 130, the battery state display software 131, the display unit 140, the battery state display picture 141, the keyboard 150, the microcomputer 151 for the keyboard, the battery controller 160, and the smart batteries 161 and 162.

Further, as shown in FIG. 1, in the personal computer 100 of the embodiment, the CPU 110 for controlling the whole of the personal computer 100, the memory 120 in which the operating system 121, the APM-BIOS 122 and the SMB-BIOS 123 are stored, the magnetic disk unit 130 in which the battery state display software 131 is stored, the display unit 140 for displaying the battery state display picture 141, the keyboard 150 including the keyboard microcomputer 151, and the battery controller 160 for controlling the smart batteries 161 and 162 are connected.

The SMB-BIOS 123 stored in the memory 120 of the personal computer 100 is a basic input/output system (BIOS) for battery management for supporting the standard specification "smart battery". Further, the APM-BIOS 122 is a basic input/output system (BIOS) for power management for supporting portion relative to the remaining operating time of the battery management.

The battery state display software 131 stored in the magnetic disk unit 130 of the personal computer 100 is a software which is started by a user at the user's discretion to display the state of the smart batteries 161 and 162 onto the battery state display picture 141 of the display unit 140 on the basis of data obtained from the smart batteries 161 and 162.

The smart batteries 161 and 162 controlled by the battery controller 160 of the embodiment are batteries of different kinds such as the NiMH battery and the Li ion battery which support the standard specification "smart battery".

Figure 2:
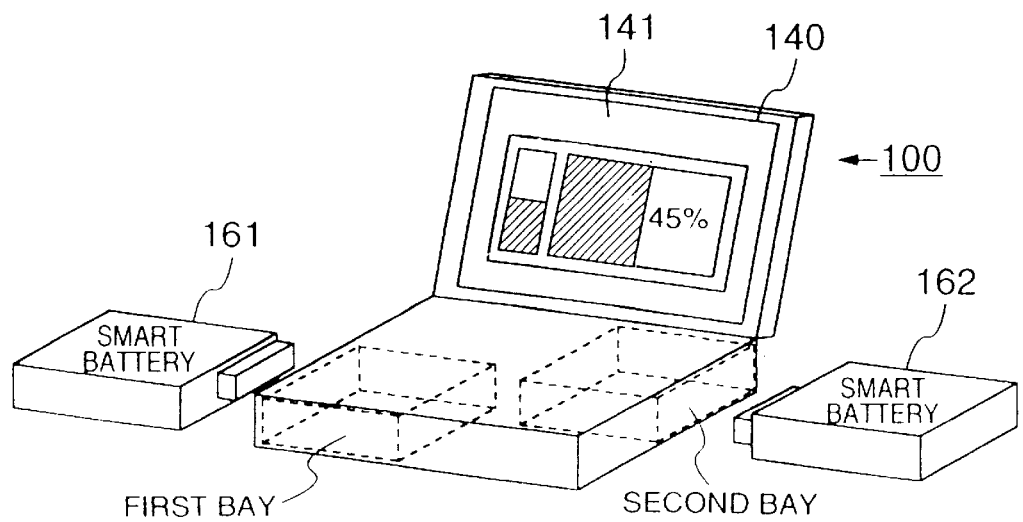
FIG. 2 is a perspective view showing an external appearance of the personal computer.

FIG. 2 shows the external appearance of the personal computer 100 of the embodiment.

As shown in FIG. 2, the personal computer 100 of the embodiment includes two slots of first and second bays into which the smart batteries 161 and 162 are mounted detachably. Either slot can accommodate any battery of different kind.

Further, states of the smart batteries 161 and 162 mounted into the first and second bays are displayed on the battery state display picture 141 of the display unit 140 of the personal computer 100.

As shown in FIG. 2, since the personal computer 100 including the battery controller 160 of the embodiment includes the first and second bays into which the smart batteries 161 and 162 are mounted detachably, two batteries can be mounted therein simultaneously, so that the personal computer 100 can be operated for a long time by the batteries.

Figure 3:
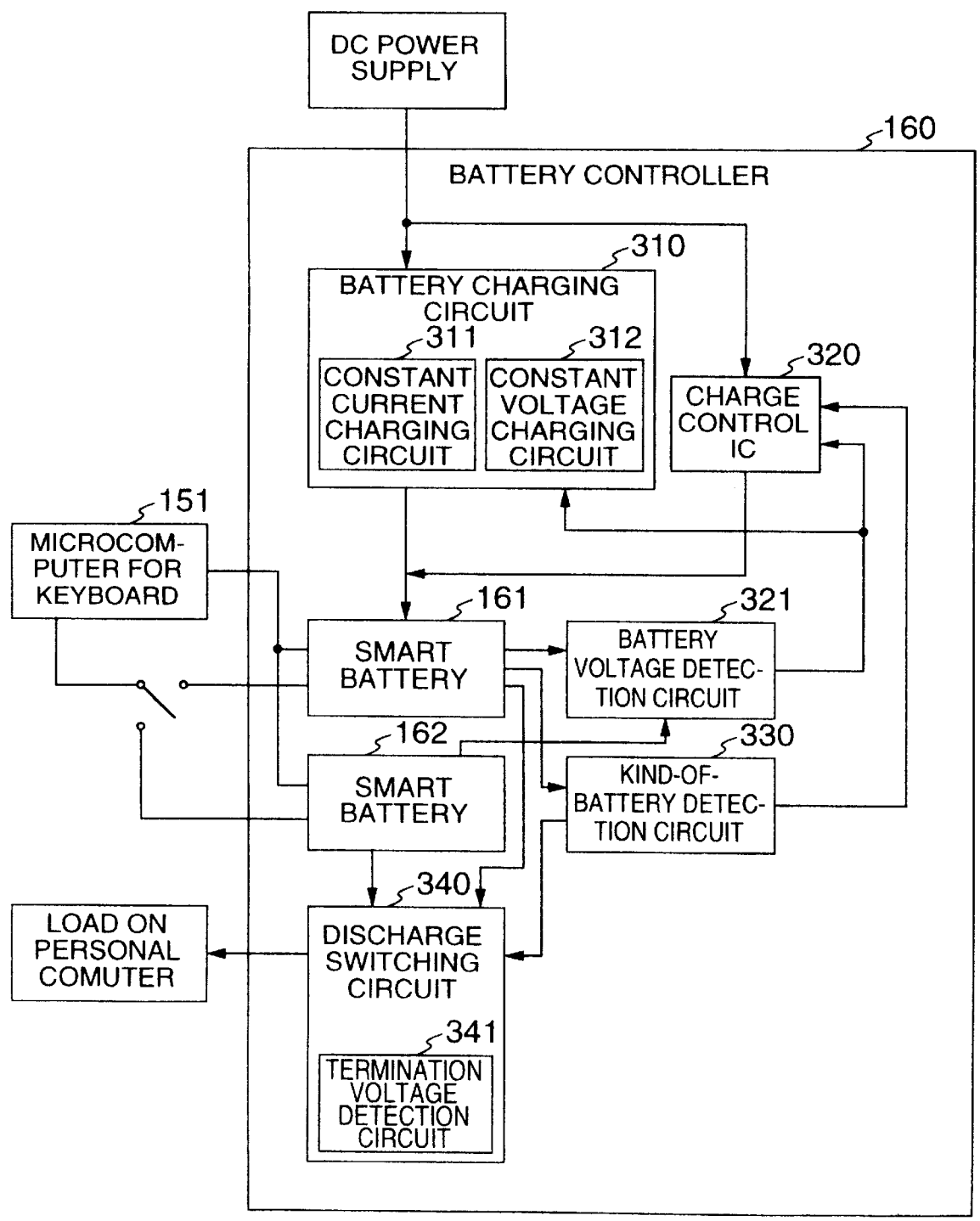
FIG. 3 is a block diagram schematically illustrating the battery controller of the present invention.

FIG. 3 is a schematic diagram illustrating the battery controller 160 of the embodiment. In FIG. 3, numeral 310 denotes a battery charging circuit, 311 a constant current charging circuit, 312 a constant voltage charging circuit, 320 a charge control IC, 321 a battery voltage detection circuit, 330 a kind-of-battery detection circuit, 340 a discharge switching circuit, and 341 a termination voltage detection circuit. The kind-of-battery detection circuit 330 is for detecting the kind of type of the battery used and is never for discriminating different kinds of battery or the same kind of battery.

As shown in FIG. 3, the battery controller 160 of the embodiment includes the battery charging circuit 310, the constant current charging circuit 311, the constant voltage charging circuit 312, the charge control IC 320, the battery voltage detection circuit 321, the kind-of-battery detection circuit 330, the discharge switching circuit 340, and the termination voltage detection circuit 341.

Further, as shown in FIG. 3, in the battery controller 160 of the embodiment, the microcomputer 151 for the keyboard is used as a host LSI of the standard specification "smart battery" and controls the smart batteries 161 and 162 by connecting the charge control IC 320, the battery voltage detection circuit 321, the kind-of-battery detection circuit 330 and the discharge switching circuit 340.

The battery charging circuit 310 of the battery controller 160 of the embodiment includes the constant current charging circuit 311 and the constant voltage charging circuit 312 and can charge batteries of different kinds.

The charge control IC 320 of the battery controller 160 of the embodiment controls the constant current charging circuit 311 or the constant voltage charging circuit 312 of the battery charging circuit 310 in accordance with a signal from the battery voltage detection circuit 321 to charge the smart batteries 161 and 162.

The kind-of-battery detection circuit 330 of the battery controller 160 of the embodiment detects a kind of battery by means of thermistor terminals of the smart batteries 161 and 162.

The discharge switching circuit 340 of the battery controller 160 of the embodiment measures discharge voltages of the smart batteries 161 and 162 and switches a discharge battery for supplying electric power to the personal computer 100 in accordance with a voltage value thereof.

Further, the termination voltage detection circuit 341 of the discharge switching circuit 340 measures discharge voltages of the smart batteries 161 and 162 and shifts the operation of the personal computer 100 to a suspended mode in accordance with a voltage value thereof.

Figure 4:
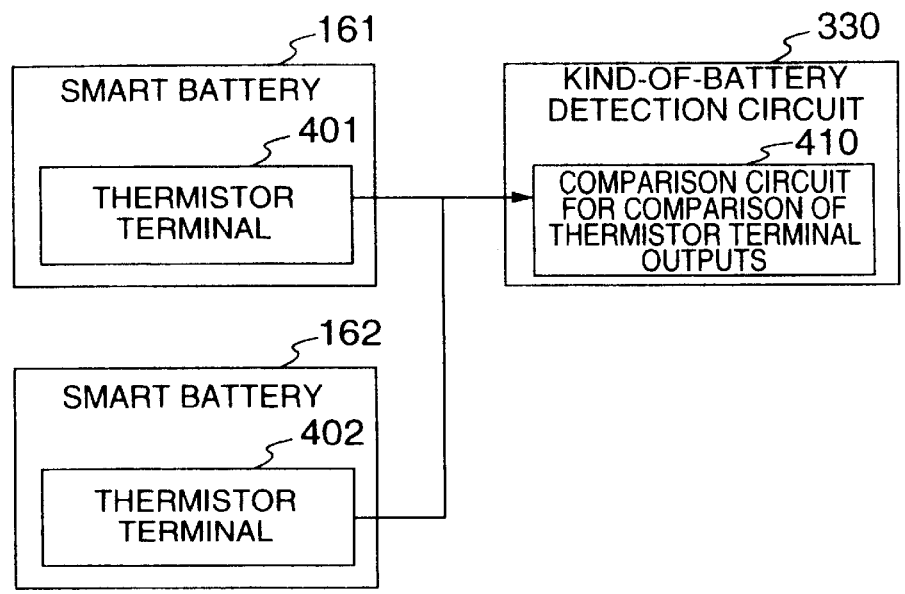
FIG. 4 is a block diagram illustrating a kind-of-battery detecting operation provided by the battery controller of the present invention.

FIG. 4 illustrates the kind-of-battery detection operation of the battery controller 160 of the embodiment. In FIG. 4, numerals 401 and 402 denote thermistor terminals, and 410 a comparison circuit for comparing outputs of the thermistor terminals.

As shown in FIG. 4, the kind-of-battery detection operation of the battery controller 160 of the embodiment is performed by means of the thermistor terminals 401 and 402 and the comparison circuit 410 for comparing the outputs of the thermistor terminals.

Further, as shown in FIG. 4, in the kind-of-battery detection operation of the battery controller 160 of the embodiment, impedances of the thermistor terminals 401 and 402 provided in the smart batteries 161 and 162 are measured and the measured impedance values are compared in the comparison circuit 410 to detect the kinds of the batteries.

The thermistor terminals 401 and 402 of the smart batteries 161 and 162 are provided to detect temperatures of the smart batteries 161 and 162 and particularly are used to detect completion of charging of the NiMH battery.

More particularly, the output of the thermistor terminal of the NiMH battery is varied in accordance with a temperature at a high impedance while the output of the thermistor terminal of the Li ion battery is constant at a low impedance and accordingly when the NiMH battery and the Li ion battery are used as the smart batteries 161 and 162, the impedances of the thermistor terminals 401 and 402 can be measured to thereby detect the kinds of the batteries.

Figure 5:
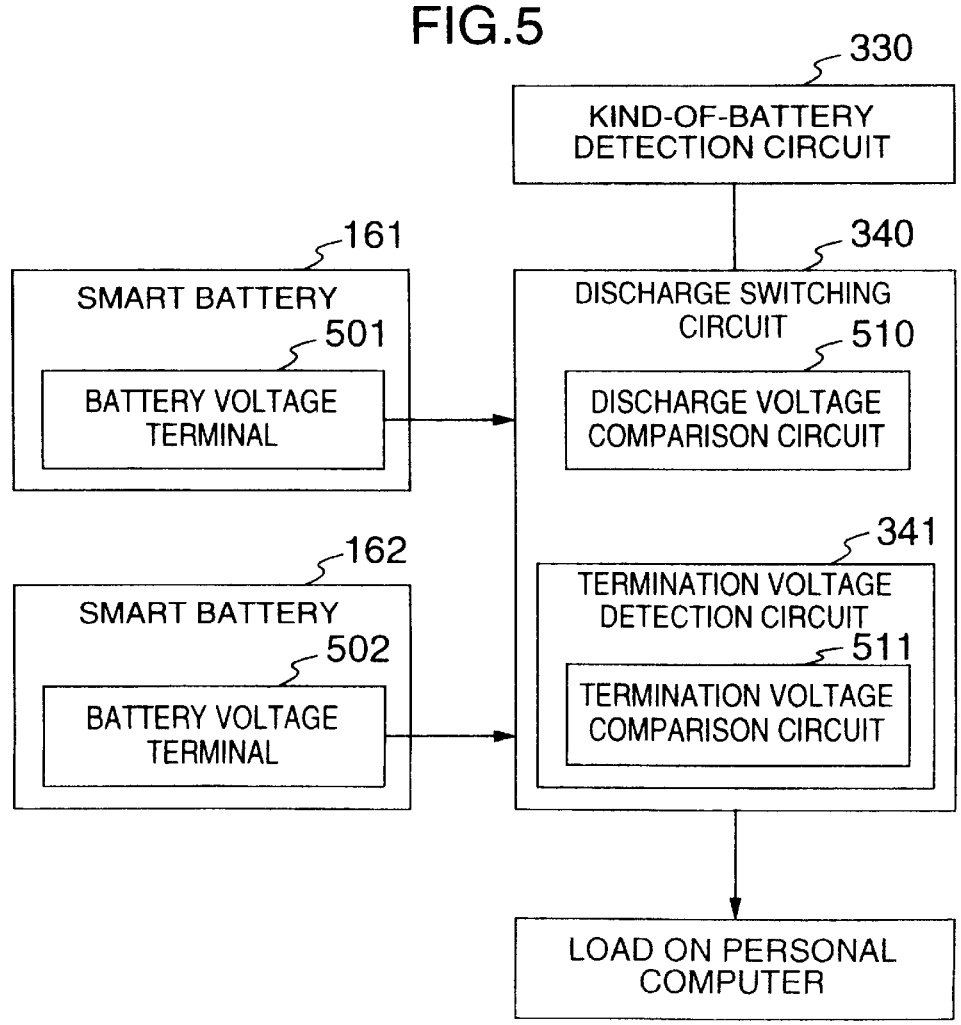
FIG. 5 is a block diagram illustrating a battery discharge switching operation and a termination voltage detecting operation provided by the battery controller of the present invention.

FIG. 5 illustrates the discharge switching operation and the termination voltage detection operation of the battery controller 160 of the embodiment. In FIG. 5, numerals 501 and 502 denote battery voltage terminals, 510 a discharge voltage comparison circuit and 511 a termination voltage comparison circuit.

As shown in FIG. 5, the discharge switching operation and the termination detection operation of the battery controller 160 of the embodiment are performed by means of the battery voltage terminals 501 and 502, the discharge voltage comparison circuit 510 and the termination voltage comparison circuit 511.

Further, as shown in FIG. 5, in the discharge switching operation and the termination voltage detection operation of the battery controller 160 of the embodiment, output voltages of the battery voltage terminals 501 and 502 of the smart batteries 161 and 162 are measured, so that switching of the battery for discharging or shift to the suspended mode is performed by means of the discharge voltage comparison circuit 510 and the termination voltage comparison circuit 511.

The discharge voltage comparison circuit 510 of the discharge switching circuit 340 compares the output voltages from the battery voltage terminals 501 and 502 of the smart batteries 161 and 162 in accordance with a detection result from the kind-of-battery detection circuit 330 to judge whether a voltage value for switching the discharging battery is reached or not.

Further, the discharge voltage comparison circuit 510 of the discharge switching circuit 340 compares the output voltages from the battery voltage terminals 501 and 502 of the smart batteries 161 and 162 in accordance with the detection result from the kind-of-battery detection circuit 330 to judge whether the very low battery voltage for shifting the personal computer 100 to the suspended mode is reached or not.

The termination voltage comparison circuit 511 of the termination voltage detection circuit 341 compares the output voltages from the battery voltage terminals 501 and 502 of the smart batteries 161 and 162 in accordance with the detection result from the kind-of-battery detection circuit 330 to judge whether a voltage value for shifting to the suspended mode is reached or not.

Figure 6:
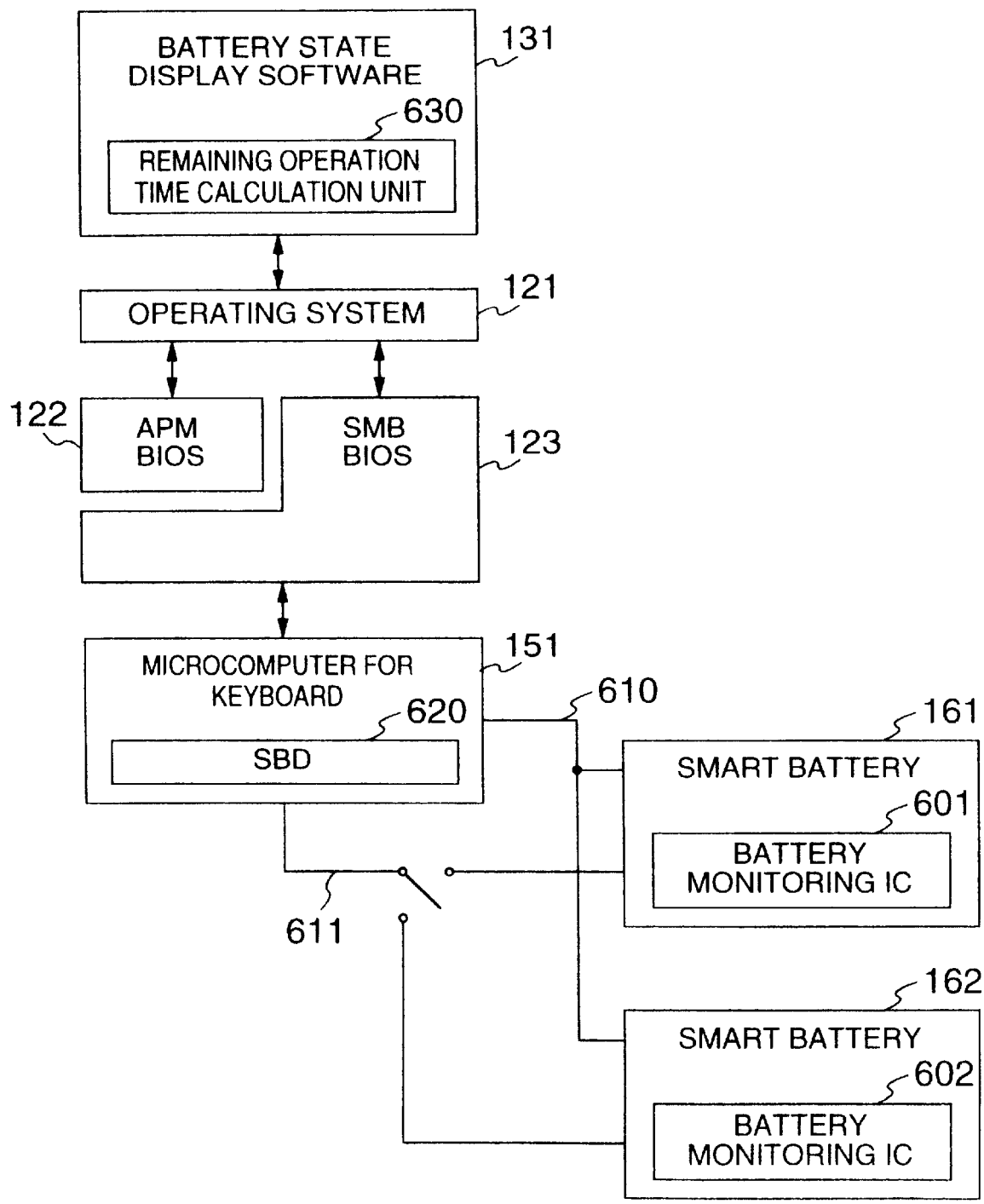
FIG. 6 is a block diagram illustrating a smart battery data obtaining operation provided by the battery controller of the present invention.

FIG. 6 illustrates the smart battery data obtaining operation of the battery controller of the embodiment. In FIG. 6, numerals 601 and 602 denotes battery monitoring ICs, 610 a system management bus, 611 a clock line, 620 a smart battery data, and 630 a remaining operation time calculation unit.

As shown in FIG. 6, the smart battery data obtaining operation of the battery controller 160 of the embodiment is performed by means of the battery monitoring ICs 601 and 602, the system management bus 610, the clock line 611, the smart battery data 620 and the remaining operation time calculation unit 630.

Further, as shown in FIG. 6, in the smart battery data obtaining operation of the battery controller 160 of the embodiment, the smart batteries 161 and 162 and the microcomputer 151 for the keyboard are connected by means of the system management bus 610 and the clock line 611 is switched to thereby obtain the smart battery data 620.

In the battery controller 160 of the embodiment, the battery monitoring ICs 601 and 602 included in the smart batteries 161 and 162 are ICs defined in the standard specification "smart battery" and which serve to detect terminal voltage, discharging/charging currents, temperatures of battery cells and the like of the smart batteries 161 and 162.

The smart battery data 620 of the battery controller 160 of the embodiment include data indicative of states of the smart batteries 161 and 162 produced by the battery monitoring ICs 601 and 602 and the like. The smart battery data 620 include, for example, data such as the "average current data" indicative of an average discharging current in one minute, the average time to empty data" indicative of a remaining operation time until a remaining amount of the battery is reduced to zero at the average discharging current and the "remaining capacity data" indicative of a remaining capacity of the battery.

The remaining operation time calculation unit 630 of the battery state display software 131 uses the smart battery data 620 to calculate the total remaining operation time of the plurality of smart batteries 161 and 162.

Description is now made to operation for performing charging, discharging and display of the remaining operation time of the smart batteries 161 and 162 of different kinds in the personal computer 100 including the battery controller 160 of the embodiment in combination with the microcomputer 151 for the keyboard.

In the personal computer 100 including the battery controller 160 of the embodiment, the microcomputer 151 for the keyboard performs polling by means of the system management bus 610 and examines whether the smart batteries 161 and 162 are mounted in the first or second bay.

When the microcomputer 151 for the keyboard detects that the battery is mounted in any of the first or second bay, the mounted battery is set as the discharge battery. When the batteries are mounted in both of the bays, the battery mounted in the first bay is set as the discharge battery and flag information indicating which of batteries is being discharged is set.

The kind-of-battery detection circuit 330 of the battery controller 160 of the embodiment measures impedances of the thermistor terminals 401 and 402 of the smart batteries 161 and 162 and produces different signals in accordance with the measured impedance values as kind-of-battery detection signals.

The discharge switching circuit 340 of the battery controller 160 of the embodiment supplies the kind-of-battery detection signal produced by the kind-of-battery detection circuit 30 and the output voltage from the battery voltage terminal 501 or 502 of the smart battery 161 or 162 set in the discharge battery by the microcomputer 151 for the keyboard to the discharge voltage comparison circuit 510.

The discharge voltage comparison circuit 510 of the discharge switching circuit 340 sets the low battery voltage in accordance with the kind-of-battery detection signal produced by the kind-of-battery detection circuit 330 and examines whether the output voltage of the battery being discharged reaches the low battery voltage or not.

The low battery voltage is a voltage for switching the battery. In the battery controller 160 of the embodiment, when the output voltage of the smart battery 161 being discharged reaches the low battery voltage, the smart battery 161 is switched or changed to the smart battery 162, so that the smart battery 162 is discharged.

As the result that the discharge voltage comparison circuit 510 of the discharge switching circuit 340 examines the output voltage of the battery being discharged, when the output voltage of the battery being discharged reaches the low battery voltage, the battery to be discharged is switched to the battery mounted in the second bay and flag information indicating which battery is being discharged is changed to indicate the battery mounted in the second bay.

Further, when any battery is not mounted in the second bay in case where the battery being discharged is switched, the battery being discharged continues to be discharged even after the output voltage of the battery being discharged reaches the low battery voltage.

As described above, when the battery being discharged continues to be discharged even after the output voltage of the battery being discharged reaches the low battery voltage, the discharge voltage comparison circuit 510 of the discharge switching circuit 340 sets the very low battery voltage in accordance with the kind-of-battery detection signal produced by the kind-of-battery detection circuit 330 and examines whether the output voltage of the battery being discharged reaches the very low battery voltage or not.

As the result that the discharge voltage comparison circuit 510 of the discharge switching circuit 340 examines the output voltage of the battery being discharged, when the output voltage of the battery being discharged reaches the very low battery voltage, a signal for shifting the personal computer 100 to the suspended mode is produced.

When the personal computer 100 receives the signal for shifting the personal computer 100 to the suspended mode, the personal computer 100 turns off the backlight of the display unit 140 and stops the usual operation so that the personal computer is shifted to the mode in which the consumption power is suppressed extremely.

In the suspended mode, when the battery which has been charged completely is newly mounted in the bay in which the battery is not discharged or an external power supply is connected, the personal computer 100 can be returned to the usual operation again.

In the suspended mode, when the battery which has been charged completely is not mounted or the external power supply is not connected, the termination voltage comparison circuit 511 of the termination voltage detection circuit 341 sets the termination voltage in accordance with the kind-of-battery detection signal produced by the kind-of-battery detection circuit 330 and examines whether the output voltage of the battery being discharged reaches the termination voltage or not.

As the result that the termination voltage comparison circuit 511 of the termination voltage detection circuit 341 examines the output voltage of the battery being discharged, when the output voltage of the battery being discharged reaches the termination voltage, supply of electric power to the personal computer 100 is stopped.

When the external power supply is connected after electric power is supplied by the discharge battery as described above, the charge control IC 320 of the battery controller 160 of the embodiment operates the constant current charging circuit 311 or the constant voltage charging circuit 312 in accordance with the kind-of-battery detection signal from the kind-of-battery detection circuit 330 to start charging of the smart batteries 161 and 162.

Further, when the batteries are charged by the constant voltage charging circuit 312, the charge control IC 320 of the battery controller 160 of the embodiment controls the charge voltage of the battery charging circuit 310 in accordance with the signal from the battery voltage detection circuit 321 to charge the smart batteries 161 and 162.

As described above, in the battery controller 160 of the embodiment, the kind of the smart batteries 161 and 162 is detected by the kind-of-battery detection circuit 330 and discharge or charge is made in accordance with the kind-of-battery detection signal, while the battery detected by the kind-of-battery detection circuit 330 may be any battery equipped with the thermistor terminal 401 or 402 from which the kind of the battery can be detected and is not necessarily required to be a battery which supports the standard specification "smart battery".

When the battery state display software 131 is started while the personal computer 100 including the battery controller 160 of the embodiment is operated, the remaining operation time calculation unit 630 of the battery state display software 131 requires the smart battery data 620 to the microcomputer 151 for the keyboard through the operating system 121, the APM-BIOS 122 and the SMB-BIOS 123.

The microcomputer 151 for the keyboard switches the clock line 611 and obtains the smart battery data 620 of the smart batteries 161 and 162 from the battery monitoring ICs 601 and 602 through the system management bus 610.

The smart battery data 620 of the battery controller 160 of the embodiment include data such as the average discharge current, the remaining operation time and the remaining capacity as described above.

Figure 7:
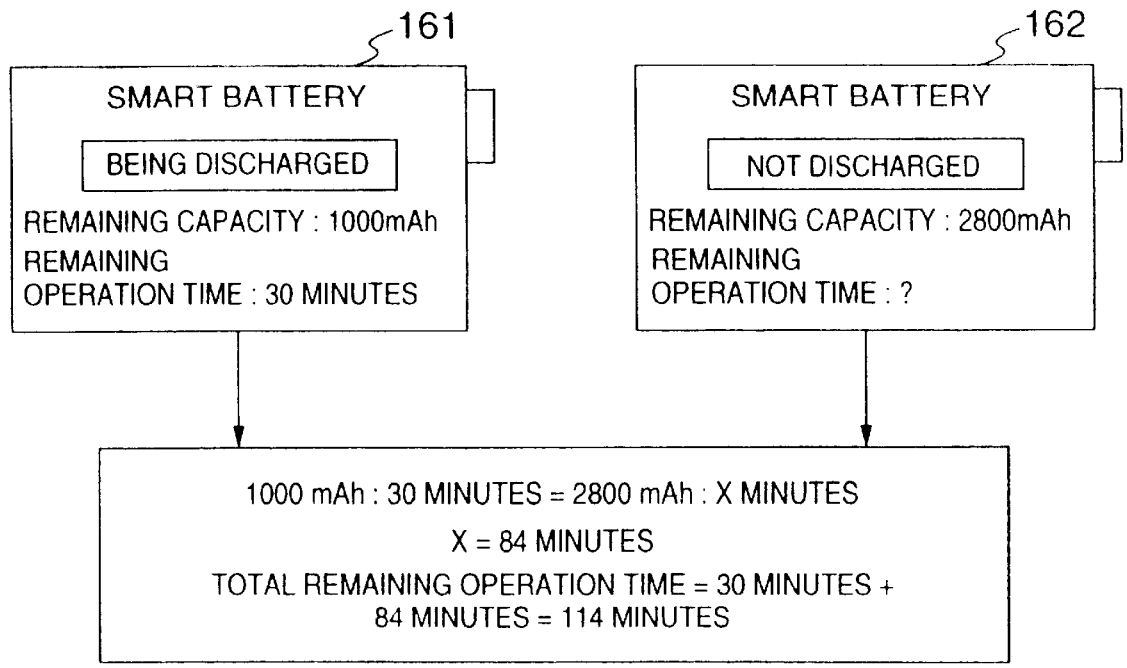
FIG. 7 is a block diagram illustrating a remaining operation time calculating process provided by the battery controller of the present invention.

FIG. 7 illustrates the remaining operation time calculation process of the battery controller 160 of the embodiment.

As shown in FIG. 7, in the remaining operation time calculation process of the battery controller 160 of the embodiment, the remaining capacity and the remaining operation time of the smart battery 161 being discharged and the remaining capacity of the smart battery 162 not discharged are used to calculate the remaining operation time of the smart battery 162 not discharged and calculate the total remaining operation time of the smart batteries 161 and 162.

As described above, the battery monitoring ICs 601 and 602 included in the smart batteries 161 and 162 report the respective remaining operation times to the microcomputer 151 for the keyboard which is the host LSI as the smart battery data 620.

However, since the average discharge current value of the smart battery 162 not discharged is very small, the remaining operation time reported by the battery monitoring IC 602 of the smart battery 162 not discharged has an extremely large value.

Accordingly, even if the respective remaining operation times sent from the battery monitoring ICs 601 and 602 are added together, the exact total remaining operation time of the smart batteries 161 and 162 cannot be obtained.

Thus, as shown in FIG. 7, the remaining operation time calculation unit 630 of the battery state display software 131 calculates the remaining operation time "84 minutes" from a ratio of the remaining capacity "1000 mAh" and the remaining operation time "30 minutes" of the smart battery 161 being discharged and the remaining capacity "2800 mAh" of the smart battery 162 not discharged and adds the remaining operation time "30 minutes" of the smart battery 161 to the remaining operation time "84 minutes" of the smart battery 162 to obtain the total remaining operation time "114 minutes".

The calculation of the total remaining operation time is made when one of the batteries is being discharged, while even when electric power is supplied by the external power supply and both of the batteries are not discharged, the total remaining operation time can be calculated by memorizing the remaining capacity and the remaining operation time during supply of electric power by the battery.

Figure 8:
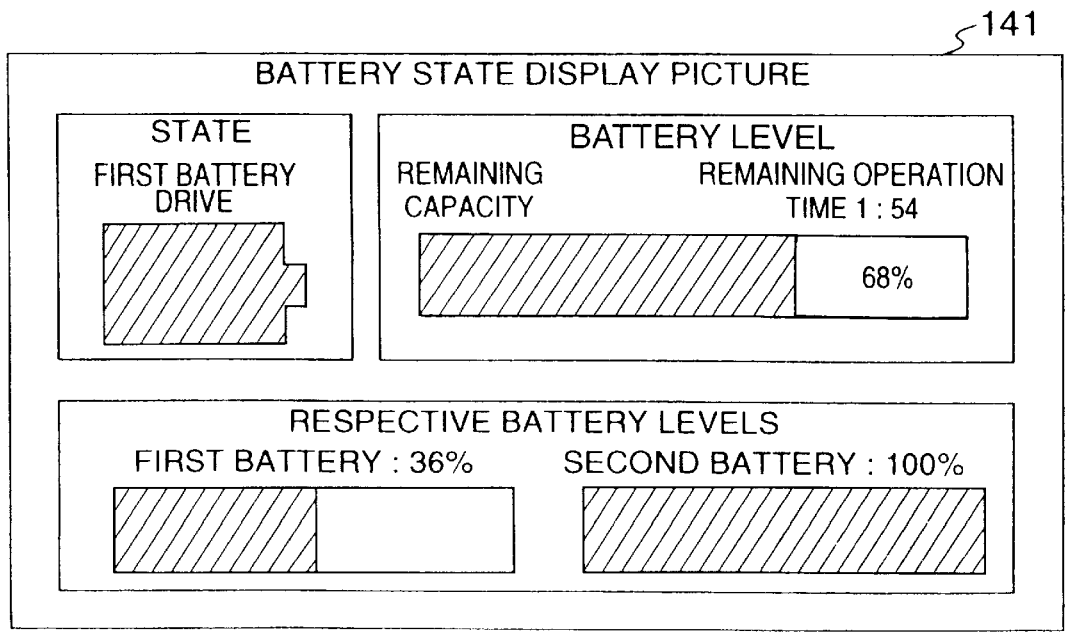
FIG. 8 is a block diagram illustrating an example of a battery state display picture provided in the battery controller of the present invention.

FIG. 8 shows an example of the battery state display picture 141 of the battery controller 160 of the embodiment.

As shown in FIG. 8, the state of supplying electric power, the total remaining operation time and the respective remaining capacities of the batteries calculated by the remaining operation time calculation unit 630 of the battery state display software 131 are displayed in the battery state display picture 141 of the battery controller 160 of the embodiment.

Further, in the battery controller 160 of the embodiment, the battery control microcomputer may be used to make charging and discharging of the batteries of different kinds and display of the remaining operation time.

Figure 9:
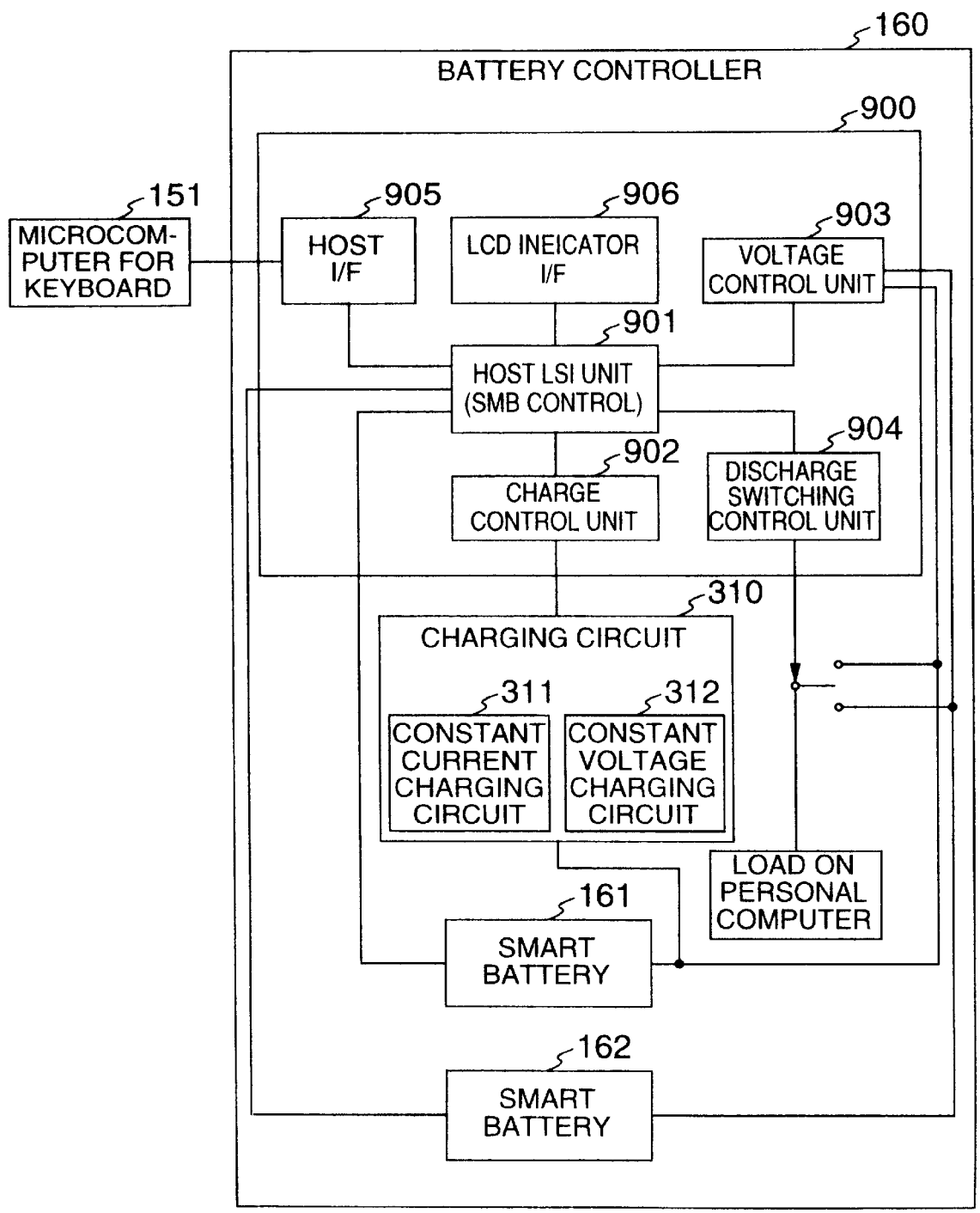
FIG. 9 is a block diagram schematically illustrating a battery controlling microcomputer provided in the battery controller of the present invention.

FIG. 9 schematically illustrates the battery control microcomputer of the battery controller 160 of the embodiment. In FIG. 9, numeral 900 denotes a battery control microcomputer, 901 a host LSI unit, 902 a charge control unit, 903 a voltage control unit, 904 a discharge switching control unit, 905 a host interface, and 906 an LCD indicator interface.

As shown in FIG. 9, the battery control microcomputer of the battery controller 160 of the embodiment includes the host LSI unit 901, the charge control unit 902, the voltage control unit 903, the discharge switching control unit 904, the host interface 905 and the LCD indicator interface 906.

Further, as shown in FIG. 9, the battery control microcomputer 900 of the battery controller 160 of the embodiment is connected to the battery charging circuit 310, the smart batteries 161 and 162 and the microcomputer 151 for the keyboard, and the host LSI unit 901 of the battery control microcomputer 900 is connected to the charge control unit 902, the voltage control unit 903, the discharge switching control unit 904, the host interface 905 and the LCD indicator interface 906.

The host LSI unit 901 of the battery control microcomputer 900 corresponds to the host LSI of the standard specification "smart battery". The host LSI unit controls the whole of the battery control microcomputer 900 and detects a kind of the battery on the basis of the smart battery data 620 obtained from the smart batteries 161 and 162.

The charge control unit 902 of the battery control microcomputer 900 controls the constant current charging circuit 311 or the constant voltage charging circuit 312 of the battery charging circuit 310 in accordance with the signal from the voltage control unit 903 to charge the smart batteries 161 and 162.

The discharge switching control unit 904 of the battery control microcomputer 900 measures discharge voltages of the smart batteries 161 and 162 and switches the discharge battery for supplying electric power to the personal computer 100 in accordance with the measured voltage value.

Further, the discharge switching control unit 904 of the battery control microcomputer 900 shifts the personal computer 100 to the suspended mode in accordance with the discharge voltage values of the smart batteries 161 and 162.

The host interface 905 of the battery control microcomputer 900 is an interface for sending the smart battery data 620 through the microcomputer for the keyboard to the battery state display software 131.

The LCD indicator interface 906 of the battery control microcomputer 900 is an interface used to display the smart battery data 620 onto the LCD.

As described above, according to the battery controller of the embodiment, since the battery switching voltage, the suspended mode shift voltage and the termination voltage which have different values in accordance with the detected kind of the battery and are previously set are utilized to make discharging, the capacity of the battery of different kind can be used effectively and overdischarging can be prevented.

Further, according to the battery controller of the embodiment, since charging is made in combination of the constant current charging and the constant voltage charging operation in accordance with the detected kind of the battery, the battery of different kind can be charged effectively.

In addition, according to the battery controller of the embodiment, since the data of the battery being discharged is used to calculate the remaining operation time of the battery not discharged, the total remaining operation time of the plurality of batteries can be calculated.

Although the present invention has been described definitely with reference to the embodiment, the present invention is not limited to the embodiment and it is a matter of course that various changes and modifications may be made without departing from the spirit and scope thereof.

Brief description of the effects obtained by representative aspects disclosed in the present invention is as follows:

(1) Since the battery switching voltage, the suspended mode shift voltage and the termination voltage which have different values in accordance with the detected kind of the battery and are previously set are utilized to make discharging, the capacity of the battery of different kind can be used effectively and overdischarging can be prevented.

(2) Since charging is controlled in combination of the constant current charging and the constant voltage charging operation in accordance with the detected kind of the battery, the battery of different kind can be charged effectively.

(3) Since the data of the battery being discharged is used to calculate the remaining operation time of the battery not discharged, the total remaining operation time of the plurality of batteries can be calculated.

We claim:

1. A battery controller for controlling at least two batteries of different kinds, comprising:

kind-of-battery detection means for detecting a kind of battery; and battery switching means in which a switching voltage, a suspended mode shift voltage and a termination voltage having different values in accordance with the kind of the battery detected by said kind-of-battery detection means are previously set to compare an output voltage of a battery being discharged with said previously set switching voltage, suspended mode shift voltage and termination voltage so that switching of the battery being discharged, stopping of operation of an apparatus being supplied with electric power by the battery being discharged or stopping of supply of electric power by the battery being discharged is performed.

2. A battery controller according to claim 1, comprising:

battery charging means for charging the batteries of various kinds in combination of constant current charging and constant voltage charging; and charge control means for controlling said battery charging means in accordance with the kind detected by said kind-of-battery detection means.

3. A battery controller according to claim 1, wherein said kind-of-battery detection means measures an impedance of a thermistor terminal of each battery to thereby detect the kind of the battery.

4. A battery controller according to claim 1, wherein each of the batteries includes a thermistor terminal, a battery voltage terminal and a battery monitoring IC.

5. A note-type personal computer including a battery controller for controlling at least two batteries of different kinds, comprising:

kind-of-battery detection means for detecting a kind of battery; and battery switching means in which a switching voltage, a suspended mode shift voltage and a termination voltage having different values in accordance with the kind of the battery detected by said kind-of-battery detection means are previously set to compare an output voltage of a battery being discharged with said previously set switching voltage, suspended mode shift voltage and termination voltage so that switching of the battery being discharged, stopping of operation of an apparatus being supplied with electric power by the battery being discharged or stopping of supply of electric power by the battery being discharged is performed.

\* \* \* \* \*